(12) United States Patent
Osato

(10) Patent No.: US 11,340,289 B2
(45) Date of Patent: May 24, 2022

(54) ELECTRICAL CONTACTOR AND ELECTRICAL CONNECTING APPARATUS

(71) Applicant: KABUSHIKI KAISHA NIHON MICRONICS, Tokyo (JP)

(72) Inventor: Eichi Osato, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 266 days.

(21) Appl. No.: 16/784,847

(22) Filed: Feb. 7, 2020

(65) Prior Publication Data

US 2020/0319245 A1 Oct. 8, 2020

(30) Foreign Application Priority Data

Apr. 4, 2019 (JP) .............................. JP2019-072224

(51) Int. Cl.
 *G01R 31/28* (2006.01)
 *H01R 13/24* (2006.01)
 *G01R 1/04* (2006.01)

(52) U.S. Cl.
 CPC ....... *G01R 31/2886* (2013.01); *G01R 1/0466* (2013.01); *H01R 13/2407* (2013.01); *H01R 13/2442* (2013.01)

(58) Field of Classification Search
 CPC G01R 31/2886; G01R 1/0466; G01R 1/0408; G01R 1/0458; G01R 1/0416; H01R 13/2407; H01R 13/2442
 See application file for complete search history.

(56) References Cited

U.S. PATENT DOCUMENTS

| 7,147,477 B2* | 12/2006 | Soh ........................ H01R 12/57 439/66 |
| 7,192,320 B2* | 3/2007 | Yasumura .......... H01R 13/2407 439/862 |
| 2012/0064226 A1* | 3/2012 | Chen .................. G01R 1/07357 427/58 |

FOREIGN PATENT DOCUMENTS

JP 2014-516158 A 7/2014
WO WO2012165936 A1 12/2012

* cited by examiner

*Primary Examiner* — Akm Zakaria
(74) *Attorney, Agent, or Firm* — Bacon & Thomas, PLLC

(57) ABSTRACT

An electrical contactor capable of coping with an electrical test under a high temperature environment and realizing reliable positioning is provided.
An electrical contactor includes: a planar body portion formed of a conductive member; an upper arm having a cantilever beam structure, including an upper base extending integrally and continuously upward from the body portion, an upper supporting portion extending in a horizontal direction from the upper base along the body portion, and a first distal end extending vertically upward from the upper supporting portion to make electrical contact with a first contact target; a lower arm having a cantilever beam structure, including a lower base extending integrally and continuously downward from the body portion, a lower supporting portion extending in a horizontal direction from the lower base along the body portion, and a second distal end extending vertically downward from the lower supporting portion to make electrical contact with a second contact target; a first positioning portion extending upward from one end of the body portion; and a second positioning portion extending upward from near the other end of the body portion.

13 Claims, 9 Drawing Sheets

ELECTRICAL CONTACTOR AND ELECTRICAL CONNECTING APPARATUS

CROSS-REFERENCE TO RELATED APPLICATIONS

The present application claims, under 35 USC 119, priority of Japanese Patent Application No. 2019-072224 filed on Apr. 4, 2019.

TECHNICAL FIELD

The present disclosure relates to an electrical connecting apparatus and can be applied to an electrical contactor and an electrical connecting apparatus used for a conduction test of a testing target, for example.

DESCRIPTION OF RELATED ART

Conventionally, in the manufacturing process of integrated circuits, an electrical characteristics test called a package test or a final test, for example, is performed on packaged integrated circuits. Such a test uses an electrical connecting apparatus (so-called a test socket) that causes an electrical contactor to make electrical contact with an electrode terminal of an integrated circuit in a state in which the integrated circuit which is a testing target is held in a state of being detachably attached state. An integrated circuit attached to the electrical connecting apparatus is electrically connected to a testing device (a tester) via the electrical connecting apparatus to test electrical characteristics.

Patent Document 1 discloses an electrical interconnect assembly used for testing IC devices. The electrical interconnect assembly has a plurality of test contacts (electrical contactors) and each electrical contactor has a first electrical connection portion that electrically connects electrode terminals of a testing target and a second electrical connection portion for electrically connecting test terminals on a wiring substrate. The plurality of electrical contactors are supported by an approximately cylindrical biasing member formed of an elastomer, for example, along an arrangement direction thereof, and the biasing member applies elastic force to the first and second electrical connection portions so that electrical connection between the first electrical connection portion and the electrode terminals of the testing target and electrical connection between the second electrical connection portion and the test terminals of the wiring substrate are maintained.

PATENT DOCUMENT

Patent Document 1: Japanese Patent Laid-Open 2014-516158

BRIEF SUMMARY OF INVENTION

However, in order to test electrical characteristics of integrated circuits usable at high temperatures, it is required to test integrated, circuits under a high temperature environment. However, in the electrical interconnect assembly having a biasing member formed of an elastomer or the like as disclosed in Patent Document 1, the biasing member may deteriorate under a high temperature environment and a contact load between the electrical contactors and the electrode terminals of a testing target may decrease. Therefore, it is desirable that the electrical contactors make electrical contact with test terminals and electrode terminals of the testing target with a high load under a high temperature environment.

It is also desirable to improve positioning accuracy of each electrical contactor when a plurality of electrical contactors making electric contact with each of the terminals of a substrate and the electrode terminals of a testing target is attached to an electrical connecting apparatus.

Therefore, the present disclosure provides electrical contactor and an electrical connecting apparatus capable of coping with an electrical test under a high temperature environment and realizing positioning easily and reliably.

In order to solve the problems, an electrical contactor of a first aspect of the present disclosure includes: (1) a planar body portion formed of a conductive member; (2) an upper arm having a cantilever beam structure, including an upper base extending integrally and continuously upward from the body portion, an upper supporting portion extending in a horizontal direction from the upper base along the body portion, and a first distal end extending vertically upward from the upper supporting portion to make electrical contact with a first contact target; (3) a lower arm having a cantilever beam structure, including a lower base extending integrally and continuously downward from the body portion, a lower supporting portion extending in a horizontal direction from the lower base along the body portion, and a second distal end extending vertically downward from the lower supporting portion to make electrical contact with a second contact target; (4) a first positioning portion extending upward from one end of the body portion; and (5) a second positioning portion extending upward from near the other end of the body portion.

An electrical contactor according to a second aspect of the present disclosure includes: two electrical contactors according to the first aspect of the present disclosure; and an insulating member sandwiched between the plurality of electrical contactors.

An electrical connecting apparatus according to a third aspect of the present disclosure includes: a substrate on which wires are formed; a housing portion that accommodates a plurality of the electrical contactors according to the first aspect of the present disclosure on the substrate; and a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via the electrical contactors, wherein the housing portion has a first hole for accommodating a first positioning portion at one end of each of the electrical contactors and a second hole for accommodating a second positioning portion at the other end of each of the electrical contactors, the first and second holes formed in an upper surface of an accommodating portion for accommodating the plurality of electrical contactors.

According to the present disclosure, it is possible to cope with an electrical test under a high temperature environment and realize positioning easily and reliably.

DETAILED DESCRIPTION OF INVENTION (A) Main Embodiment

Hereinafter, an embodiment of an electrical contactor and an electrical connecting apparatus according to the present disclosure will be described in detail with reference to the drawings.

(A-1) Configuration of Embodiment

[Electrical Connecting Apparatus]

Hereinafter, a configuration of an electrical connecting apparatus will be described with reference to FIGS. 1 to 5.

Figure 1:
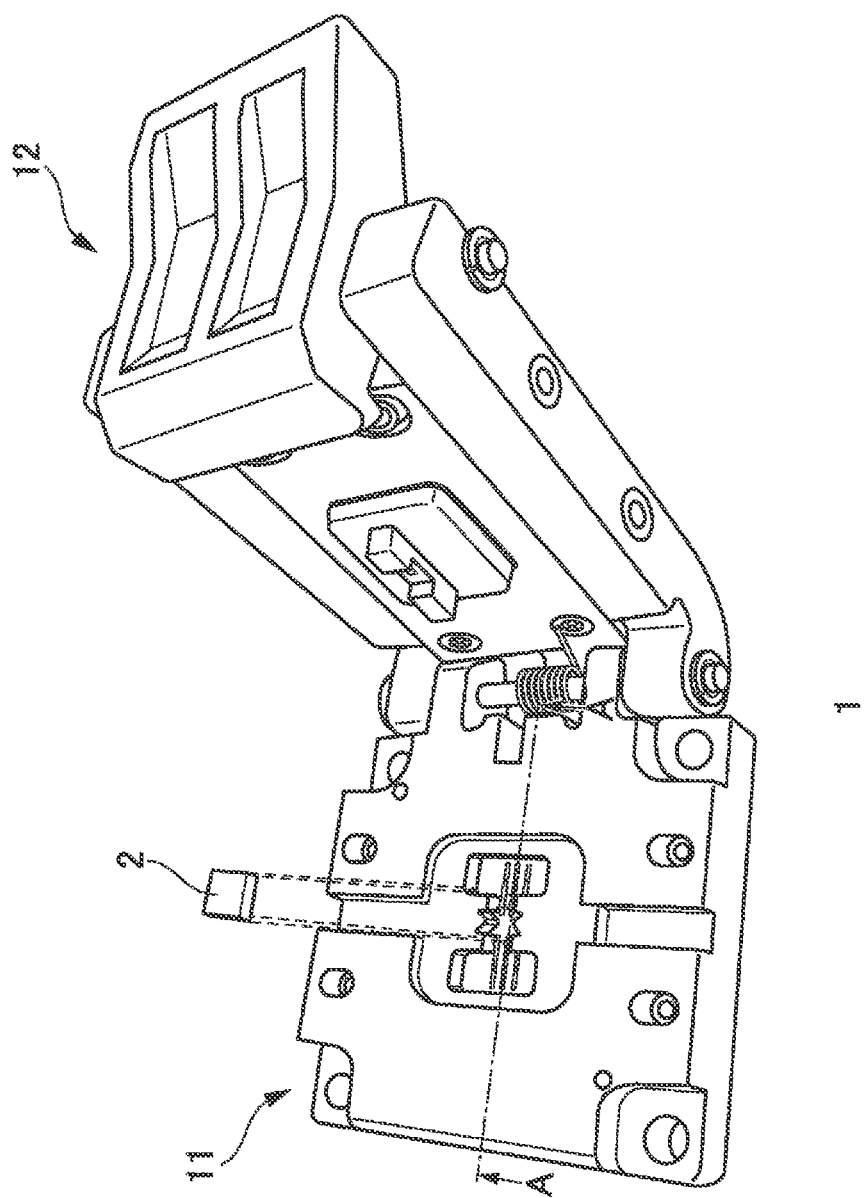
FIG. 1 is a perspective view illustrating an entire configuration of an electrical connecting apparatus according to an embodiment.
Figure 2:
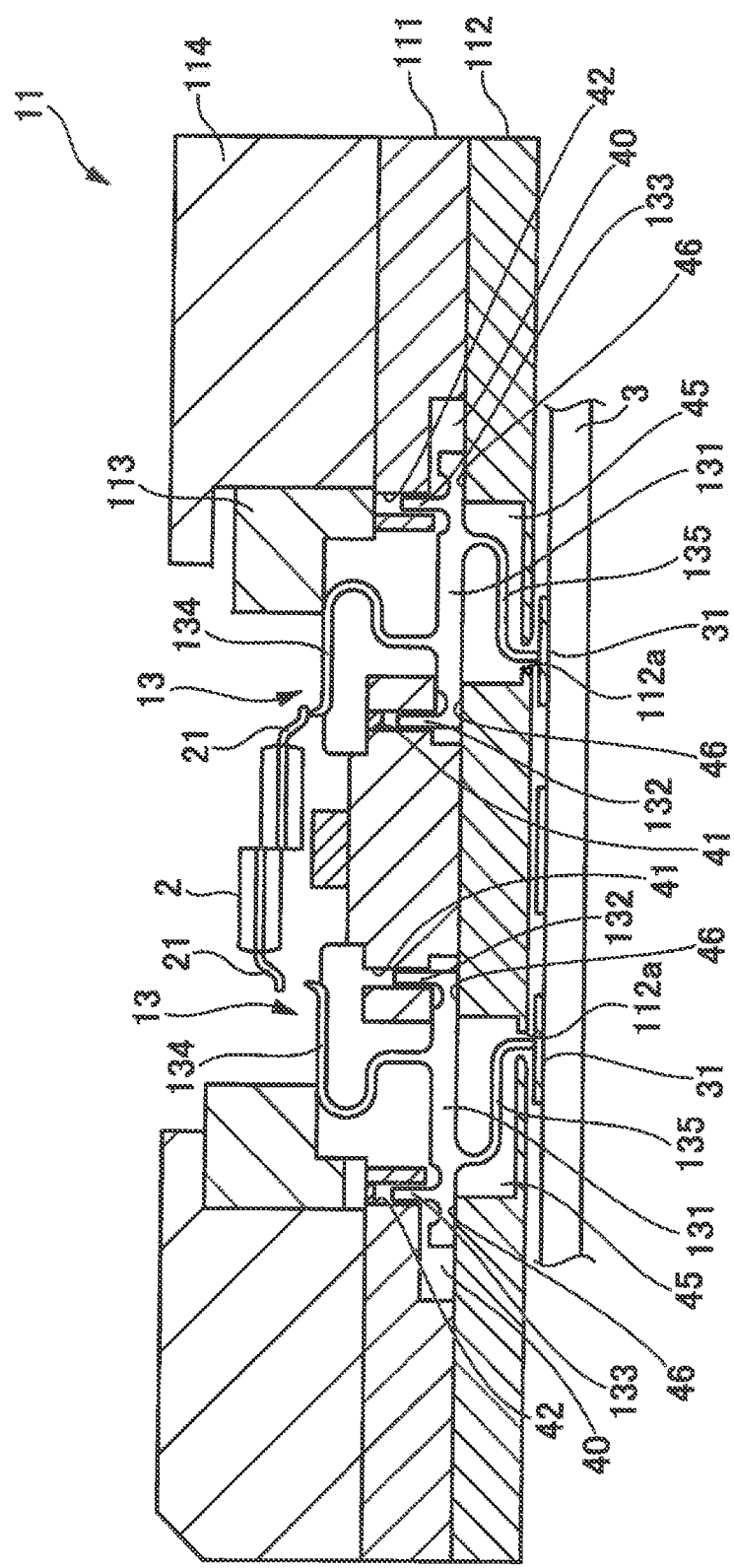
FIG. 2 is a cross-sectional view along arrow A-A in FIG. 1.
Figure 3:
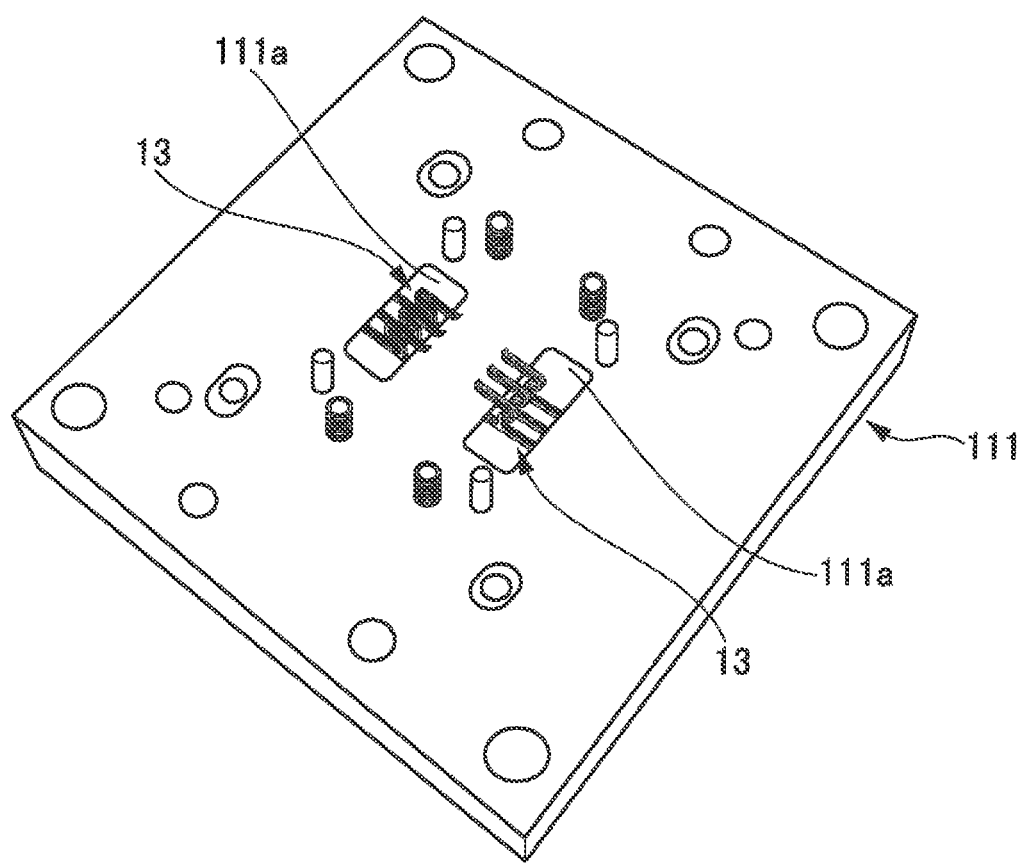
FIG. 3 is a diagram illustrating a configuration of an upper surface of an upper housing portion according to an embodiment.
Figure 4:
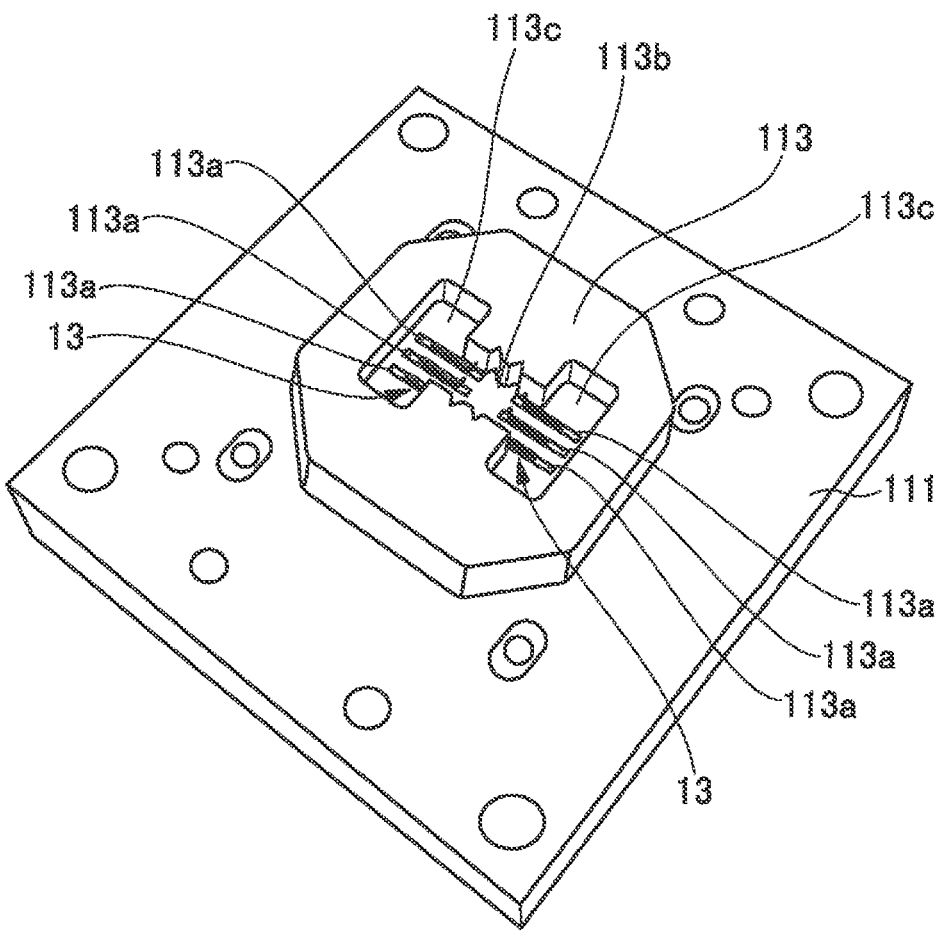
FIG. 4 is a diagram illustrating a configuration in which a floating guide portion is provided on the upper surface of the upper housing portion according to an embodiment.
Figure 5:
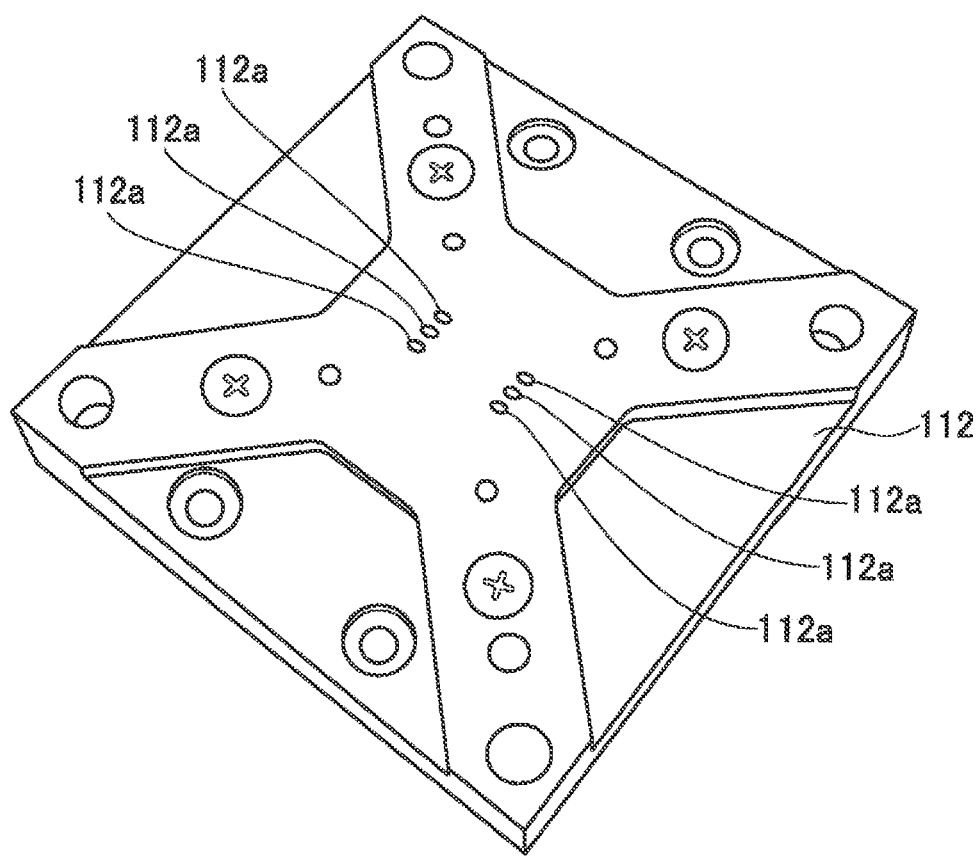
FIG. 5 is a diagram illustrating a configuration of a lower surface of a lower housing portion according to an embodiment.

FIG. 1 is a perspective view illustrating an entire configuration of an electrical connecting apparatus according to the present embodiment. FIG. 2 is a cross-sectional view along arrow A-A in FIG. 1. The left half of a testing target 2 in FIG. 2 illustrates a state in which an electrode terminal 21 of the testing target 2 is not in contact with an electrical contactor 13, and the right half of the testing target 2 illustrates a state in which the testing target 2 is pushed in so that the electrode terminal 21 of the testing target 2 is in contact with the electrical contactor 13. FIG. 3 is a diagram illustrating a configuration of an upper surface of an upper housing portion FIG. 4 is a diagram illustrating a configuration in which a floating guide portion 113 is provided on the upper surface of the upper housing portion 111, and FIG. 5 is a diagram illustrating a configuration of a lower surface of a lower housing portion 112.

As illustrated in FIG. 1, the electrical connecting apparatus 1 has a base 11 fixed to a test substrate and a cover 12 that fixes the testing target 2 accommodated in the base 11 and is provided so as to be openable with respect to the base 11.

The electrical connecting apparatus is used for testing the electrical characteristics of the testing target 2 such as an IC package, for example. More specifically, the electrical connecting apparatus 1 is used as a test IC socket used in an electrical test (for example, a package test, a final test, and the like) of an integrated circuit as the testing target 2.

A plurality of electrical contactors 13 (see FIG. 2) that make contact with electrode terminals 21 (first contact targets) of the testing target 2 are mounted on the base 11 of the electrical connecting apparatus 1, and the testing target 2 is attached to a central portion of the base 11. When the cover 12 is closed, the testing target 2 is pushed in and the electrode terminal 21 of the testing target 2 makes electrical contact with a distal end 54 of each of the electrical contactors 13. The base 11 of the electrical connecting apparatus 1 is provided on the substrate 3, a lower end of the electrical contactor 13 makes electrical contact with a wiring pattern 31 (second contact target), and the electrical characteristics of the testing target 2 are tested.

As illustrated in FIG. 2, the substrate 3 to which the electrical connecting apparatus 1 is attached is a wiring substrate formed of an electrically insulating member, for example. A wiring pattern 31 formed from a metallic material having conductive properties is formed on the upper surface of the substrate 3 by a printed wiring technology, for example. The wiring pattern 31 is connected to a wiring pattern of a testing device (not illustrated), and the base 11 of the electrical connecting apparatus 1 is fixed to the surface of the substrate 3 on which the wiring pattern 31 is formed.

The wiring pattern 31 is formed at a position corresponding to the positions of the electrical contactors 13 mounted on the base 11 of the electrical connecting apparatus 1. That is, the wiring pattern 31 is formed on the substrate 3 so as to be electrically connected to the distal end 63 of the lower arm 135 of each of the electrical contactors 13.

As illustrated in FIG. 2, the base 11 includes a lower housing portion 112, a upper housing portion 111 provided on an upper surface of the lower housing portion 112, a floating guide portion 113 provided in the central portion of the upper housing portion 111, and a frame portion 114.

The frame portion 114 is formed of an electrically insulating member and is fixed to the upper surface of the upper housing portion 111 in a state in which a peripheral edge of the upper surface of the floating guide portion 113 provided on the upper surface of the upper housing portion 111 is locked.

As illustrated in FIG. 4, a testing target accommodation portion 113b having a concave shape to which the testing target 2 is detachably attached is provided in the central portion of the floating guide portion 113. The testing target accommodation portion 113b has an accommodation wall vertical to the substrate 3 in order to realize reliable positioning of the accommodated testing target 2. Moreover, a concave portion 113c formed to be continuous to the concave shape of the testing target accommodation portion 113b is formed on both sides of the testing target accommodation portion 113h having the concave shape of the floating guide portion 113. A plurality of slits 113a is formed in a bottom portion of each of the concave portions 113c formed on both sides of the testing target accommodation portion 113b.

The electrical contactors 13 are disposed on the lower side of the plurality of slits 113a, the distal ends 54 of the electrical contactors 13 protrude from the slits 113a, and the distal ends 54 of the electrical contactors 13 make electrical contact with the electrode terminals 21 of the testing target 2. The plurality of slits 113a are arranged at positions corresponding to the positions of the plurality of electrode terminals 21 of the testing target 2, and adjacent slits 113a are partitioned by partition walls.

The upper housing portion 111 and the lower housing portion 112 are formed of an electrically insulating member and are members that accommodate the plurality of electrical contactors 13. More specifically, in a state in which the plurality of electrical contactors 13 are arranged between the upper housing portion 111 and the lower housing portion 112 so that the plurality of electrical contactors 13 are accommodated, the upper housing portion 111 and the lower housing portion 112 are fixed by a fixing member (for example, screws or the like). In this way, the plurality of electrical contactors 13 are accommodated between the upper housing portion 111 and the lower housing portion 112.

As illustrated in FIG. 2, first depressions 40 are formed in the lower surface of the upper housing portion 111 in order to accommodate the plurality of electrical contactors 13. Furthermore, holes 41 and 42 provided so as to extend from the lower side toward the upper side are formed in the upper surface of the first depressions 40 of the upper housing portion 111.

The holes 41 and 42 are at position corresponding to the positions of the first and second positioning portions 132 and 133 which are the two positioning portions of each of the accommodated electrical contactors 13. When the electrical contactors 13 are accommodated, the two first and second positioning portions 132 and 133 of each of the electrical contactors 13 are inserted into the holes 41 and 42, respectively, in this way, positioning of the accommodated electrical contactors 13 can be realized reliably, and the positioning accuracy of the electrical contactors 13 can be enhanced. Moreover, it is only necessary to insert the first and second positioning portions 132 and 133 of each of the electrical contactors 13 into the corresponding holes 41 and 42. Therefore, it is possible to set the electrical contactors 13 easily, stabilize the attitude of each of the electrical contactors 13, and realize reliable electrical contact between the electrode terminals 21 of the testing target 2 and the distal ends 54 of the electrical contactors 13.

Although a case is shown as an example in which the holes 41 and 42 formed in the first depression 40 of the upper housing portion 111 are holes that do not penetrate in the thickness direction of the upper housing portion 111, the holes 41 and 42 may be through-holes that penetrate in the thickness direction of the upper housing portion 111. In other words, in order to realize reliable positioning of each of the electrical contactors 13, the holes 41 and 42 may be through-holes or non-through-holes as long as the holes have a structure in which the first and second positioning portions 132 and 133 of each of the electrical contactors 13 can be inserted.

As illustrated in FIG. 3, a pair of openings 111a which are approximately rectangular openings are formed in the upper surface of the upper housing portion 111. Each of the openings 111a are formed at positions corresponding to the positions of the electrode terminals 21 of the testing target. 2, and a plurality of positioned electrical contactors 13 are disposed on the lower side of the openings 111a. That is, an upper arm 134 of each of the positioned electrical contactors 13 protrudes from the opening 111a, and the distal end 54 of the upper arm 134 makes electrical contact with the electrode terminal 21 of the testing target 2. When the testing target 2 is pushed in and the electrode terminal 21 of the testing target 2 makes contact with the distal end 54 of each of the electrical contactor 13, since the upper arm 134 of each of the electrical contactors 13 supports the testing target 2 elastically in an up-down direction, the upper arm 134 is deformed. Each of the openings 111a are formed in order to prevent the deformed upper arm 134 from making contact with the neighboring members.

As illustrated in FIG. 2, a second depression 45 depressed in the thickness direction is formed in the lower housing portion 112. A peripheral portion of the second depression 45, of the upper surface of the lower housing portion 112 serves as a supporting portion 46 that supports the body portion. 131 of each of the set electrical contactors 13 from the lower side, and the lower arm 135 of each of the electrical contactors 13 is accommodated in the second depression 45.

That is, a state in which the electrical contactor 13 is placed so that the left and right ends of the electrical contactor 13 are caught at the supporting portion 46 which is the peripheral portion of the second depression 45 of the lower housing portion 112 is created whereby the electrical contactor 13 is accommodated. Therefore, the length in the left-right direction of the second depression. 45 is shorter than the length in the left-right direction of the body portion 131 of each of the electrical contactors 13, and the supporting portion 46 of the lower housing portion 112 can support both ends of each of the positioned electrical contactors 13.

A plurality of holes 112a is formed in the bottom portion of the second depression 45 of the lower housing portion 112. As illustrated in FIG. 5, the distal ends 63 of the lower arms 135 of each of the electrical contactors 13 protrude from the plurality of holes 112a. Each of the holes 112a are formed at positions corresponding to the position of the wiring pattern 31 on the substrate 3, and the wiring pattern 31 and the distal ends 63 of the electrical contactors 13 protruding from each of the holes 112a make electrical contact reliably.

[Electrical Contactor]

Figure 6:
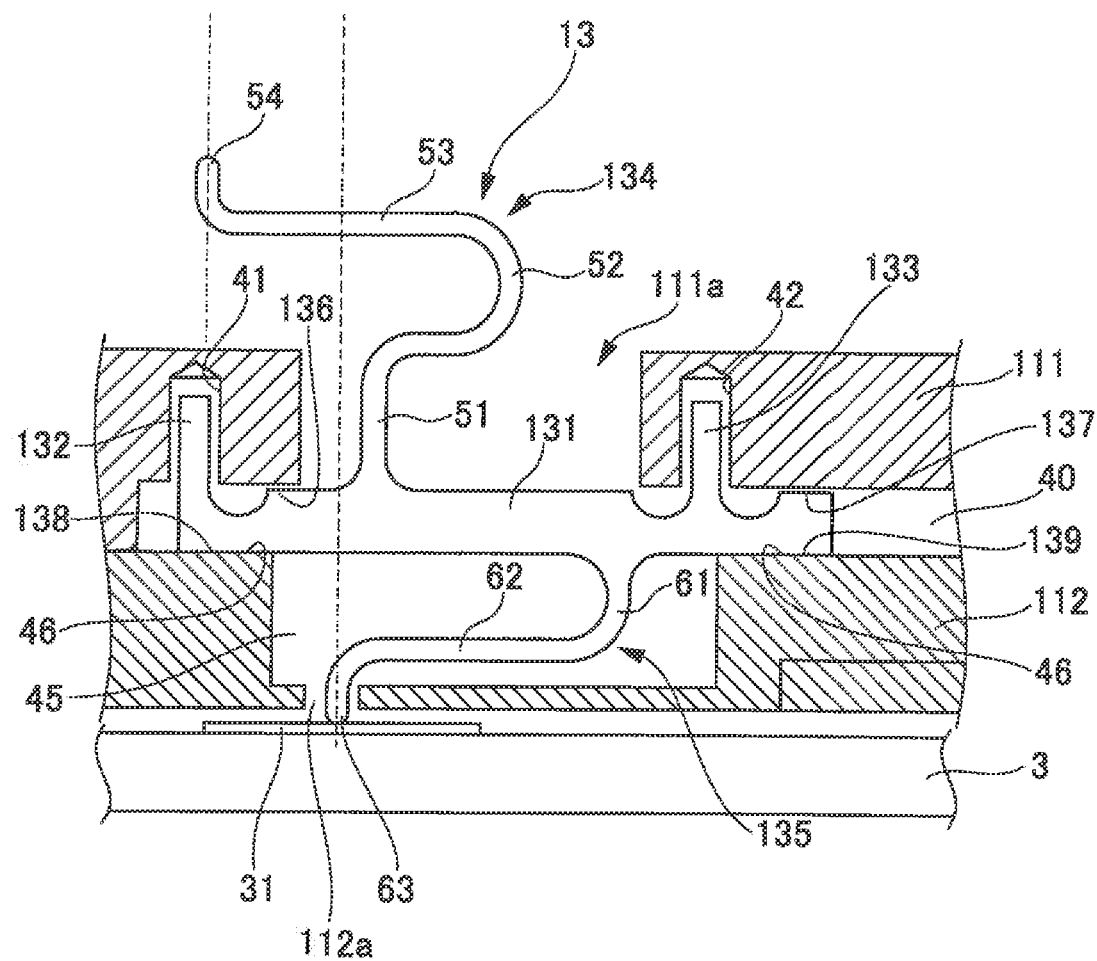
FIG. 6 is a diagram illustrating a configuration of an electrical contactor accommodated in the upper housing portion and the lower housing portion according to an embodiment.

Next, a configuration of the electrical contactor 13 will be described with reference to FIG. 6. FIG. 6 is a diagram illustrating a configuration of the electrical contactor 13 accommodated in the upper housing portion 111 and the lower housing portion 112.

The electrical contactor 13 includes the planar body portion 131, the upper arm 134 that makes electrical contact with the electrode terminal 21 of the testing target 2, the lower arm 135 that makes electrical contact with the wiring pattern 31 of the substrate 3, the first positioning portion 132 provided in one end (the left end in FIG. 6) of the body portion 131, and the second positioning portion 133 provided on the other end (the right end in FIG. 6) side of the body portion 131.

The electrical contactor 13 is formed of a generally thin planar conductive member, for example. The electrical contactor 13 may be formed of an entirely metallic member and the surface of a base may be plated with a metal material.

Since the electrical contactor 13 includes the upper arm 134 that makes electrical contact with the testing target 2 and the lower arm 135 that makes electrical contact with the substrate 3, and the entire electrical contactor 13 is formed of a conductive member such as a metallic member, it is possible to cope with an electrical test under the high temperature environment (for example, an environment of 150° C. or higher) of the testing target 2. That is, although conventionally, there was a structure that supports a plurality of electrical contactors using a biasing member such as an elastomer, when such a biasing member is used under a high temperature environment, the biasing member deteriorated and could not cope with the high temperature environment. However, by using the electrical contactor 13 of the present embodiment, it is possible to cope with the electrical test under a high temperature environment.

The body portion 131 is a planar member and is accommodated in the first depression 40 formed in the lower surface of the upper housing portion 111. The length in the up-down direction (the height direction) of the body portion 131 is approximately the same as or slightly smaller than the length in the up-down direction (the thickness direction) of the first depression 40.

The first positioning portion 132 is a convex portion positioned in one end (the left end) of the body portion 131 and extending vertically upward from the end of the body portion 131. The second positioning portion 133 is a convex portion positioned slightly close to the central portion of the body portion 131 from the other end (the right end) of the body portion 131 and extending vertically upward.

The diameters of the first and second positioning portions 132 and 133 are slightly smaller than the diameters of the holes 41 and 42. When the electrical contactor 13 is accommodated, the first positioning portion 132 is inserted into the hole 41 of the upper housing portion 111 and the second positioning portion 133 is inserted into the hole 42 of the upper housing portion 111 whereby positioning of the electrical contactor 13 is realized reliably.

That is, the first and second positioning portions 132 and 133 are provided on both, end sides of the electrical contactor 13 as two positioning portions, and the positioning of the electrical contactor 13 can be realized easily and reliably just by inserting the first and second positioning portions 132 and 133 into the holes 41 and 42, respectively.

A first lower contacting portion 138 that makes contact with the supporting portion. 46 which is the upper surface of the lower housing portion 112 and is supported by the supporting portion 46 is provided in the lower surface of the body portion 131 on the lower side of the first positioning portion 132. Moreover, a second lower contacting portion. 139 that makes contact with the supporting portion 46 which is the upper surface of the lower housing portion 112 and is supported by the supporting portion 46 is provided on the lower side of the other end of the body portion 131.

Since the first and second lower contacting portions 138 and 139 are supported by the supporting portion 46 which is the upper surface of the lower housing portion 112, it is possible to stably hold the attitude (the accommodation state) of the accommodated electrical contactor 13 and, maintain the state of the electrical contactor 13 positioned with high accuracy. Moreover, although a downward load is applied to the electrical contactor 13 when the testing target 2 is pushed in and the electrode terminal 21 of the testing target 2 makes contact with the distal end 54 of the upper arm 134, since the first and second lower contacting portions 138 and 139 are supported by the supporting portion 46, it is possible to cope with the downward load.

A first upper contacting portion 136 that makes contact with the lower surface of the first depression 40 of the upper housing portion 111 is provided in an upper portion of the body portion 131 between the first positioning portion 132 and the upper base 51 of the upper arm 134. Moreover, a second upper contacting portion 137 that can make contact with the lower surface of the first depression 40 is provided in an upper portion of the other end (the right end) of the body portion 131.

When the push-in load of the testing target 2 is applied to the electrical contactor 13, the first and second upper contacting portions 136 and 137 come into contact with the upper surface of the upper housing portion 111 whereby lifting of the electrical contactor 13 can be suppressed. That is, as will be described later, since the distal end 54 of the upper arm 134 is positioned above the position of the first positioning portion 132 of the electrical contactor 13, lifting of the right end of the electrical contactor 13 can occur when the push-in load of the testing target 2 is applied. However, since the first and second upper contacting portions 136 and 137 come into contact with the upper surface of the upper housing portion 111, the lifting of the right end of the electrical contactor 13 is suppressed.

The upper arm 134 has an upper base 51 extending vertically upward from the body portion 131, a curved portion 52 extending in a horizontal direction (the rightward direction in FIG. 6) from the upper base 51 so as to be curved in an arc form, a supporting portion 53 extending in a horizontal direction (the leftward direction in FIG. 6) from the curved portion 52, and a distal end 54 in which the end of the supporting portion 53 extends vertically upward.

The upper arm 134 has a cantilever beam structure. Therefore, when the testing target 2 is pushed in and the electrode terminal 21 of the testing target 2 makes contact with the distal end 54, since the distal end 54 moves downward and the supporting portion 53 bends in an up-down direction, the upper arm 134 has elasticity in the up-down direction. In this way, the electrode terminal 21 of the testing target 2 makes electrical contact with the distal end. 54 reliably.

The lower arm 135 has a lower base 61 extending vertically downward from the body portion 131 so as to be curved in an arc form, a supporting portion 62 extending in a horizontal direction (the leftward direction in FIG. 6) from the curved lower base 61, and a distal end 63 in which the end of the supporting portion 62 extends vertically downward.

The lower arm 135 has a cantilever beam structure. Therefore, when the testing target 2 is pushed down and the testing target 2 makes contact with the upper arm 134, although a load is also applied to the lower arm 135, since the supporting portion 62 bends in an up-down direction, the lower arm 135 has elasticity. Therefore, the distal end 63 makes electrical contact with the wiring pattern 31 of the substrate 3 reliably.

[First Modification of Electrical Contactor]

Figure 7:
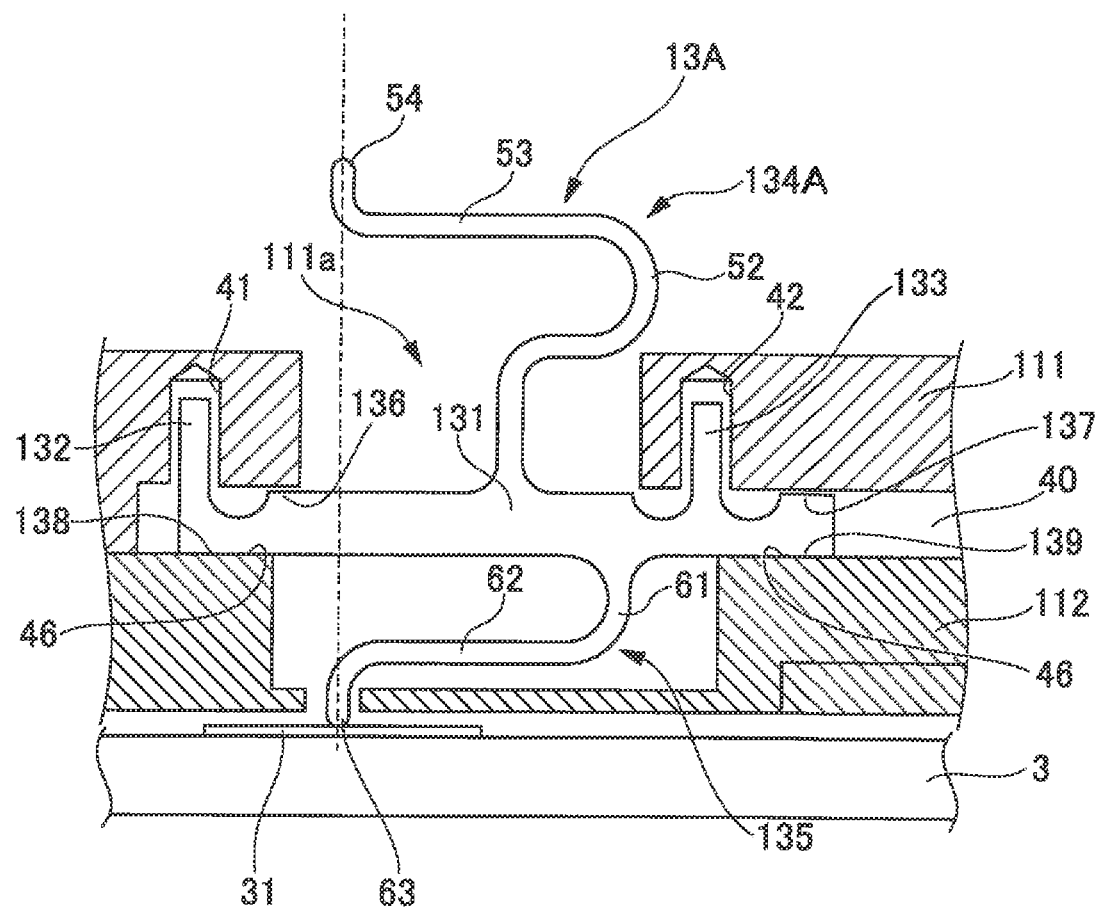
FIG. 7 is a diagram illustrating a first modification of a configuration of the electrical contactor.

FIG. 7 is a diagram illustrating a first modification of a configuration of an electrical contactor.

The electrical contactor illustrated in FIG. 7 will be referred to as an "electrical contactor 13A." In the following description, a difference between the electrical contactor 13A in FIG. 7 and the electrical contactor 13 in FIG. 6 will be described mainly while comparing the electrical contactors.

Although a basic configuration of the electrical contactor 13A in FIG. 7 is the same as the configuration of the electrical contactor 13 in FIG. 6, the position of the distal end 54 of the electrical contactor 13A in FIG. 7 is different from the position of the distal end 54 of the electrical contactor 13 in FIG. 6.

In the electrical contactor 13 in FIG. 6, the distal end 54 of the upper arm 134 is positioned closer to the left side (the side close to the electrode terminal 21 of the testing target 2) than the position of the distal end 63 of the lower arm 135.

In contrast, in the electrical contactor 13A in FIG. 7, the distal end 54 of the upper arm 134 is positioned substantially at the same position as the position of the distal end 63 of the lower arm 135.

The electrical contactor 13 in FIG. 6 can cope with the testing target 2 having a relatively small size. In contrast, the electrical contactor 13 in FIG. 7 can cope with the testing target 2 having larger size than the testing target 2 that the electrical contactor 13 in FIG. 6 can cope with.

When the size of the testing target 2 is small, since the position of the electrode terminal 21 of the testing target 2 accommodated in the testing target accommodation portion 113b is at a position close to the central portion of the testing target accommodation portion 113b, it is necessary to bring the position of the distal end 54 of the upper arm 134 toward the central portion (the side close to the testing target 2) of the testing target accommodation portion 113b. Therefore, in the electrical contactor 13 in FIG. 6, the position of the upper arm 134 is positioned closer to the central portion of the base 11, that is, closer to the left side than the central portion of the body portion 131. In this way, the position of the distal end 54 of the upper arm 134 is closer to the left side than the position of the distal end 63 of the lower arm 135.

In contrast, when the size of the testing target. 2 increases, the position of the electrode terminal 21 of the testing target 2 accommodated in the testing target accommodation portion 113b is positioned closer to the outer side than the central portion of the testing target accommodation portion 113b. Therefore, in the electrical contactor 13A in FIG. 7, since the position of the upper arm 134 is near the central portion of the body portion 131, the position of the distal end 54 of the upper arm 134 is substantially the same as the position of the distal end 63 of the lower arm 135.

In any case, as in the embodiment, according to the electrical contactors 13 and 13A including the upper arm 134 and the lower arm 135, by adjusting the position of the upper arm 134 depending on the size of the testing target 2, it is possible to adjust the position of the distal end 54 making contact with the electrode terminal 21 of the testing target 2.

Although a case in which the position of the distal end 54 of the upper arm 134 making electrical contact with the electrode terminal 21 of the testing target 2 is adjusted has been illustrated in FIGS. 6 and 7, the position of the lower arm 135 may be adjusted.

[Second Modification of Electrical Contactor]

Figure 8:
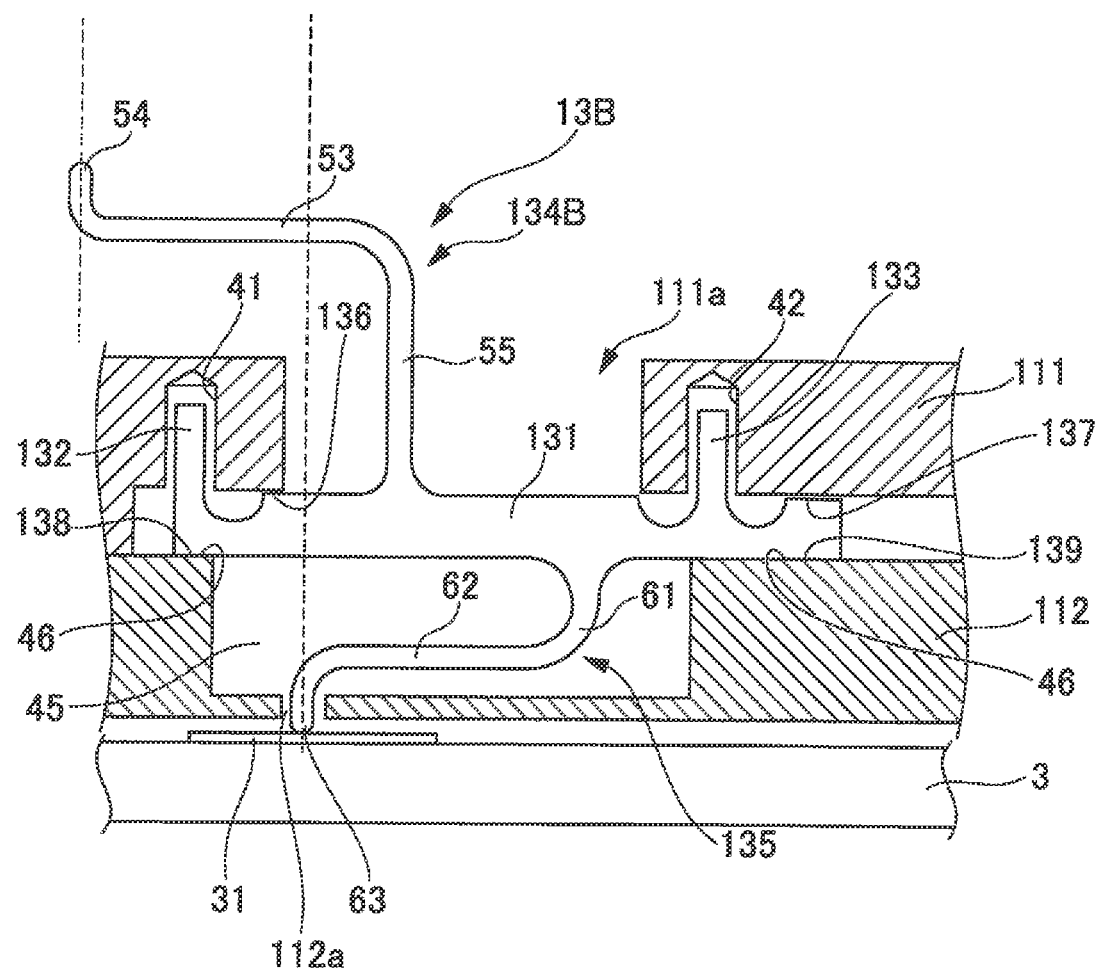
FIG. 8 is a diagram illustrating a second modification of a configuration of the electrical contactor.

FIG. 8 is a diagram illustrating a second modification of a configuration of an electrical contactor.

The electrical contactor illustrated in FIG. 8 will be referred to as an "electrical contactor 13B." In the following description, a difference between the electrical contactor 13B in FIG. 8 and the electrical contactors 13 and 13A in FIGS. 6 and 7 will be described mainly while comparing the electrical contactors.

The upper arm 134B of the electrical contactor 13B in FIG. 8 has the upper base 55 extending vertically upward from the body portion 131, the supporting portion 53 extending in a horizontal direction (the leftward direction in FIG. 8) from the upper base 55 so as to be curved in an arc form, and the distal end 54 in which the end of the supporting portion 53 extends vertically upward.

In the electrical contactor 13B in FIG. 8, the position of the distal end 54 of the upper arm 134 can be positioned further closer to the central portion of the testing target accommodation portion 113b than the position of the distal end 54 of the electrical contactor 13 in FIG. 6. In other words, the electrical contactor 13B in FIG. 8 can cope with the testing target 2 having a further smaller size than the testing target 2 having the size that the electrical contactor 13 in FIG. 6 can cope with.

Since the upper arm 134B of the electrical contactor 13B in FIG. 8 includes the upper base 55 extending vertically upward from the body portion 131, the supporting portion 53, and the distal end 54 extending vertically upward from the supporting portion 53, the positioning accuracy of the distal end 54 protruding from the slit 113a is improved further. That is, the positioning accuracy of the distal end 54 protruding from the slit 113a is enhanced, and the distal end 54 moves vertically downward immediately when the electrode terminal 21 of the testing target 2 makes contact with the distal end 54, the positioning accuracy of the distal end 54 of the electrical contactor 13B coming into contact with the electrode terminal 21 of the testing target 2 becomes reliable.

(A-2) Advantages of Embodiment

As described above, according to the present embodiment, since the electrical contactor has a structure including an upper arm having a cantilever beam structure making electrical contact with a side surface of a testing target and a lower arm having a cantilever beam structure making electrical contact with a substrate terminal, it is possible to cope with an electrical test of the testing target under a high temperature environment.

According to the present embodiment, since the electrical contactor having the upper arm having a cantilever beam structure and the lower arm having a cantilever beam structure is formed by processing a conductive member, it is possible to stabilize a contact resistance between the upper arm and the electrode terminal of the testing target and a contact resistance between the lower arm and the substrate terminal.

Further, according to the present embodiment, since the electrical contactor has two positioning portions, the positioning accuracy of the distal end with respect to the electrode terminal of the testing target can be enhanced. As a result, it is possible to realize reliable electrical contact between the distal end of the electrical contactor and the electrode terminal of the testing target.

(B) Other Embodiments

Although various modifications have been mentioned in the embodiment, the present disclosure can be also applied to the following modifications.

Figure 9:
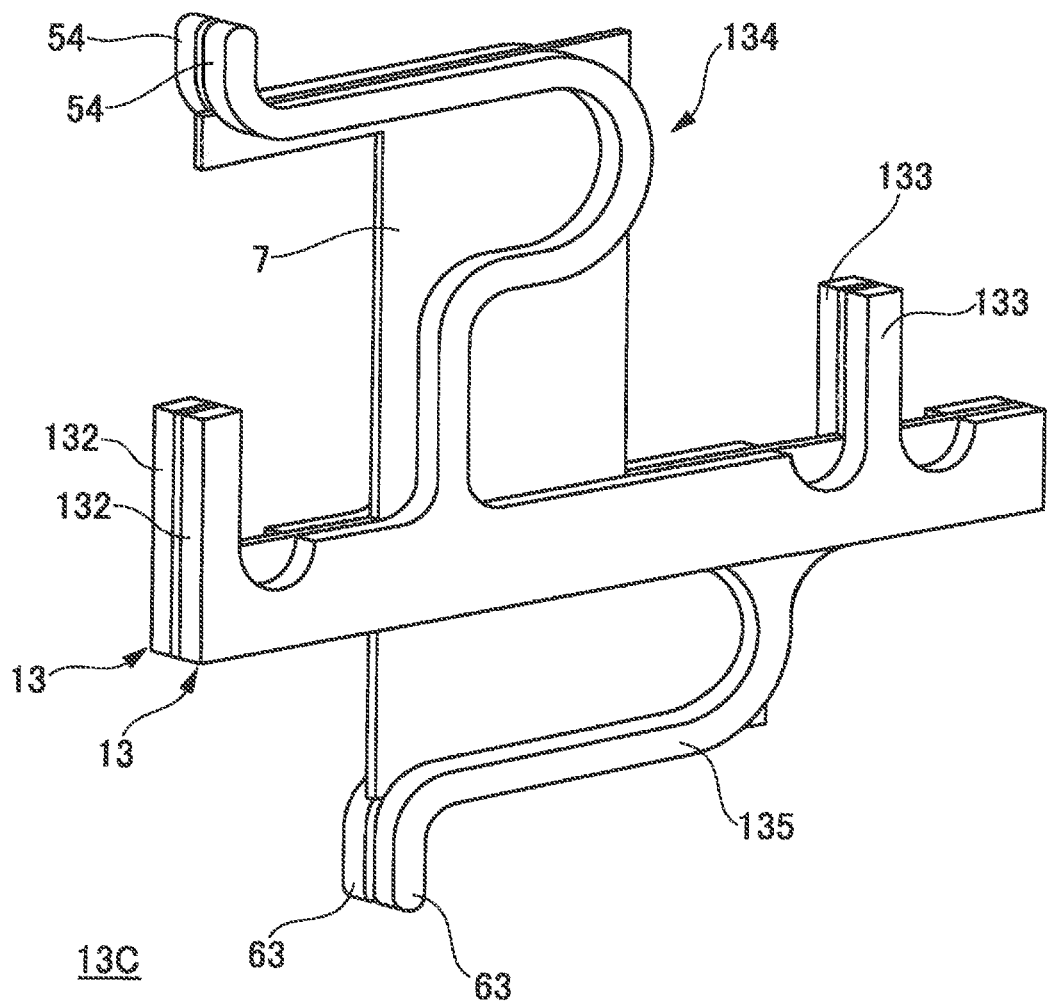
FIG. 9 is a diagram illustrating a configuration of the electrical contactor according to a modification.

FIG. 9 is a diagram illustrating a configuration of an electrical contactor according to a modification.

In FIG. 9, an electrical contactor 13C of the modification includes two electrical contactors 13 and an insulating member 7 provided between the two electrical contactors 13.

An insulating film, a planar insulating member, or the like, can be used, for example, as the insulating member 7. Although the shape of the insulating member 7 can be designed appropriately depending on the shape of the electrical contactor 13, in the case of FIG. 9, for example, the insulating member 7 has such a shape that the body portions 131, the upper arms 134, and the lower arms 135 of the two electrical contactors 13 are not conductive to each other.

Each of the two electrical contactors 13 has the same structure as the electrical contactor 13 in FIG. 6. The two electrical contactors 13 have such a structure that the insulating member 7 is sandwiched between one electrical contactor 13 and the other electrical contactor 13. That is, the insulating member 7 is sandwiched between the two electrical contactors 2 so that the two electrical contactors 13 are not conductive to each other.

In this way, when a four-wire measurement (for example, a Kelvin connection measurement) is performed with respect to the testing target 2, for example, the distal ends 54 of the upper arms 134 of the electrical contactors 13 that form the electrical contactor 13C can be brought into contact with the electrode terminals 21 for the four-wire measurement and the testing target 2 can be measured.

Although FIG. 9 illustrates a case in which the electrical contactors 13 in FIG. 6 are used, the electrical contactors 13A and 13B in FIGS. 7 and 8 may be used instead of the electrical contactors 13.

By using such a structure of the electrical contactor 13C as illustrated in FIG. 9, the electrical contactor 13C can be used during the Kelvin measurement of the testing target 2.

REFERENCE SIGNS LIST

1: Electrical connecting apparatus
11: Base
12: Cover
111: Upper housing portion
111a: Opening
112: Lower housing portion.
112a: Hole
113: Floating guide portion
113a: Slit
113b: Testing target accommodation portion
113c: Recess
114: Frame portion
13, 13A, 13B, and 13C: Electrical contactor
131: Body portion
132: First positioning portion
133: Second positioning portion
134, 134A, and 134B: Upper arm
135: Lower arm
136: First upper contacting portion
137: Second upper contacting portion
138: First lower contacting portion
139: Second lower contacting portion
51 and 55: Upper base
52: Curved portion
53: Supporting portion
54: Distal end
61: Lower base
62: Supporting portion
63: Distal end
2: Testing target
21: Electrode terminal
3: Substrate
31: Wiring pattern
40: First depression
41: Hole
42: Hole
45: Second depression
46: Supporting portion
7: insulating member

What is claimed is:

1. An electrical contactor accommodated in a housing portion that includes an upper member and a lower member, comprising:
a planar body portion placed on the lower member of the housing portion and formed of a conductive member;
an upper arm having a cantilever beam structure, including an upper base extending integrally and continuously upward from the body portion, an upper supporting portion extending in a horizontal direction from the upper base along the body portion, and a first distal end extending vertically upward from the upper supporting portion to make electrical contact with a first contact target;
a lower arm having a cantilever beam structure, including a lower base extending integrally and continuously downward from the body portion, a lower supporting portion extending in a horizontal direction from the lower base along the body portion, and a second distal end extending vertically downward from the lower supporting portion to make electrical contact with a second contact target;
a first positioning portion extending upward from one end of the body portion; and
a second positioning portion extending upward from near the other end of the body portion,
wherein the upper arm extends vertically through an opening in the upper member of the housing portion,
the lower arm extends vertically through an opening in the lower member of the housing portion,
the first positioning portion is accommodated in a first hole provided on the lower surface of the upper member of the housing portion, and
the second positioning portion is accommodated in a second hole provided on the lower surface of the lower member of the housing portion.

2. The electrical contactor according to claim 1, wherein the upper arm is provided closer to the one end than a central portion in a longitudinal direction of the body portion,
the lower arm is provided closer to the other end than the central portion in the longitudinal direction of the body portion, and
the first distal end of the upper arm is positioned closer to the one end than the position of the second distal end of the lower arm.

3. The electrical contactor according to claim 1, wherein the upper arm is provided closer to the other end than the central portion in the longitudinal direction of the body portion,
the lower arm provided closer to the other end than the central portion in the longitudinal direction of the body portion, and
the first distal end of the upper arm is positioned above the position of the second distal end of the lower arm.

4. The electrical contactor according to claim 1, wherein the upper arm is provided closer to the one end than the central portion in the longitudinal direction of the body portion,
the lower arm is provided closer to the other end than the central portion in the longitudinal direction of the body portion, and
the first distal end of the upper arm is positioned closer to an outer side than the position of the first positioning portion provided in the one end of the body portion.

5. An electrical contactor comprising:
a plurality of the electrical contactors according to claim 1; and
an insulating member sandwiched between the plurality of electrical contactors.

6. An electrical connecting apparatus comprising:
a substrate on which wires are formed;
the housing portion, which accommodates a plurality of the electrical contactors according to claim 1 on the substrate; and
a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via each of the electrical contactors, wherein
the housing portion has respective said first holes for accommodating respective said first positioning portions at one end of each of the electrical contactors and respective said second holes for accommodating respective said second positioning portions at the other end of each of the electrical contactors.

7. An electrical contactor comprising:
a plurality of the electrical contactors according to claim 2; and
an insulating member sandwiched between the plurality of electrical contactors.

8. An electrical contactor comprising:
a plurality of the electrical contactors according to claim 3; and
an insulating member sandwiched between the plurality of electrical contactors.

9. An electrical contactor comprising:
a plurality of the electrical contactors according to claim 4; and
an insulating member sandwiched between the plurality of electrical contactors.

10. An electrical connecting apparatus comprising:
a substrate on which wires are formed;
the housing portion, which accommodates a plurality of the electrical contactors according to claim 2 on the substrate; and
a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via each of the electrical contactors, wherein
the housing portion has respective said first holes for accommodating respective said first positioning portions at one end of each of the electrical contactors and respective said second holes for accommodating respective said second positioning portions at the other end of each of the electrical contactors.

11. An electrical connecting apparatus comprising:
a substrate on which wires are formed;
the housing portion, which accommodates a plurality of the electrical contactors according to claim 3 on the substrate; and
a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via each of the electrical contactors, wherein
the housing portion has respective said first holes for accommodating respective said first positioning portions at one end of each of the electrical contactors and respective said second holes for accommodating respective said second positioning portions at the other end of each of the electrical contactors.

12. An electrical connecting apparatus comprising:
a substrate on which wires are formed;
the housing portion, which accommodates a plurality of the electrical contactors according to claim 4 on the substrate; and
a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via each of the electrical contactors, wherein
the housing portion has respective said first holes for accommodating respective said first positioning portions at one end of each of the electrical contactors and respective said second holes for accommodating respective said second positioning portions at the other end of each of the electrical contactors.

13. An electrical connecting apparatus comprising:
a substrate on which wires are formed;
the housing portion, which accommodates a plurality of the electrical contactors according to claim 5 on the substrate; and
a testing target accommodation portion that accommodates a testing target at a position at which the testing target can make contact with the plurality of electrical contactors accommodated in the housing portion, the electrical connecting apparatus electrically connecting electrode portions of the testing target and the wires of the substrate via each of the electrical contactors, wherein
the housing portion has respective said first holes for accommodating respective said first positioning portions at one end of each of the electrical contactors and respective said second holes for accommodating respective said second positioning portions at the other end of each of the electrical contactors.

\* \* \* \* \*